United States Patent [19]

Schauwecker et al.

[11] Patent Number: 5,573,562
[45] Date of Patent: Nov. 12, 1996

[54] WATERTIGHT FILTER FOR ELECTRICAL EQUIPMENT VENT

[75] Inventors: Erwin Schauwecker, Schwendi-Wörenhausen; Erwin Kohler, Wain, both of Germany

[73] Assignee: Hawa Programmgehause und Komponenten GmbH & Co. KG, Wain, Germany

[21] Appl. No.: 357,451

[22] Filed: Dec. 16, 1994

[30] Foreign Application Priority Data

Dec. 24, 1993 [DE] Germany .......................... 43 44 659.0

[51] Int. Cl.$^6$ .................................................. B01D 46/00
[52] U.S. Cl. ..................... 55/385.4; 55/385.6; 55/385.7; 55/493; 55/495; 55/501; 220/371; 220/DIG. 27; 361/694; 454/184; 454/275; 454/367
[58] Field of Search ................................ 55/385.1, 385.6, 55/385.4, 385.7, 493, 495, 501, 504, 508, 511, DIG. 31, DIG. 37; 174/187; 220/371, DIG. 27; 361/694, 695; 312/229; 454/184, 275, 276, 367, 368

[56] References Cited

U.S. PATENT DOCUMENTS

| | | | |
|---|---|---|---|
| 2,291,383 | 7/1942 | Espenschied | 55/DIG. 37 |
| 2,425,250 | 8/1947 | Lamb | 55/385.1 |
| 2,470,201 | 5/1949 | Werner | 454/275 |
| 2,735,964 | 2/1956 | Grieve et al. | 55/385.6 |
| 2,825,500 | 3/1958 | McLean | 454/184 |
| 2,859,270 | 11/1958 | Patchin | 174/16.1 |
| 3,075,334 | 1/1963 | Nutting | 55/DIG. 31 |
| 3,364,338 | 1/1968 | Bradley | 454/184 |
| 3,892,169 | 7/1975 | Jarnot | 454/275 |
| 3,906,798 | 9/1975 | Dray | 73/384 |
| 3,973,477 | 8/1976 | Jakob | 454/184 |
| 4,666,479 | 5/1987 | Shoji | 55/385.4 |
| 4,730,552 | 3/1988 | Murray | 454/275 |
| 5,114,448 | 5/1992 | Bartilson | 55/DIG. 31 |
| 5,199,414 | 4/1993 | McMillon | 55/493 |
| 5,368,622 | 11/1994 | McMillon | 55/501 |
| 5,372,543 | 12/1994 | Steele | 454/184 |

FOREIGN PATENT DOCUMENTS

| | | |
|---|---|---|
| 2748737 | 5/1979 | Germany . |
| 295052 | 10/1991 | Germany . |
| 9108281 U | 10/1991 | Germany . |
| 9304064 U | 10/1993 | Germany . |
| 5-261227 | 10/1993 | Japan ................... 55/DIG. 31 |

*Primary Examiner*—Jay H. Woo
*Assistant Examiner*—Duane S. Smith
*Attorney, Agent, or Firm*—Herbert Dubno; Andrew Wilford

[57] ABSTRACT

A filter assembly is used in combination with a piece of electrical equipment having a vertical side wall formed with vent opening. The assembly has a housing secured to the side wall at the opening thereof and having a closed top side, a closed front wall, and a pair of closed end walls. The end and front walls form below the vent opening a downwardly opening mouth. A panel of air-pervious filter material in the housing has a back face turned toward the side wall at the vent opening and an opposite front face turned away from the side wall. A holder in the housing secures the filter panel therein with lower edge of its back face operatively engaging the equipment side wall below the opening and an upper edge of its front face engaging the housing front wall and with the panel tipped out away from the equipment side wall.

6 Claims, 5 Drawing Sheets

WATERTIGHT FILTER FOR ELECTRICAL EQUIPMENT VENT

FIELD OF THE INVENTION

The present invention relates to a filter. More particularly this invention concerns a filter assembly used on an intake or outlet vent of a piece of power-ventilated electrical equipment.

BACKGROUND OF THE INVENTION

It is standard, for example from old East German patent 295,052 of K. Tschirschky, German patent 2,748,737 of H. Grass, and German utility models 9,108,281 and 9,304,064, to provide a filter over a vent opening of a piece of power-ventilated electrical equipment. The filter prevents the equipment's fan from sucking in particles and also prevents particles from getting into the equipment through the intake and/or outlet hole when the fan is not running.

Such equipment is frequently provided outside or in locations where it might even be sprayed with water. Thus it is important that the filter assembly not provide a path for water to enter the equipment. This is typically done as seen in the above-cited patent references by providing angled louver openings. While such construction does largely eliminate the possibility of water getting into the device and wetting the filter medium, it substantially reduces the flow cross section of the opening, thereby reducing the capacity of the device.

OBJECTS OF THE INVENTION

It is therefore an object of the present invention to provide an improved filter assembly for a piece of vented electrical equipment.

Another object is the provision of such an improved filter assembly for a piece of vented electrical equipment which overcomes the above-given disadvantages, that is which allows full throughflow of air but which completely protects the interior of the equipment from entry of water, even if the filter device is directly sprayed.

SUMMARY OF THE INVENTION

The filter assembly of this invention is used in combination with a piece of electrical equipment having a vertical side wall formed with a vent opening. The assembly has a housing secured to the side wall at the opening thereof and having a closed top side, a closed front wall, and a pair of closed end walls. The end and front walls form below the vent opening a downwardly opening mouth. A panel of air-pervious filter material in the housing has a back face turned toward the side wall at the vent opening and an opposite front face turned away from the side wall. A holder in the housing secures the filter panel therein with a lower edge of its back face operatively engaging the equipment side wall below the opening and an upper edge of its front face engaging the housing front wall and with the panel tipped out away from the equipment side wall.

Thus the assembly has a relatively large mouth, but the filter panel is wholly above it, well protected from the elements or any spray directed at the housing whose parts are all closed, which here means imperforate so water cannot get through them. In addition virtually the entire front face of the filter panel is exposed in the housing to air drawn in through the mouth, and virtually the entire back face is exposed in the housing. Thus the filter panel is exploited over substantially its entire surface.

According to the invention the holder is formed of a rigid sheet lying against the filter panel and formed with a plurality of large-area holes defining narrow webs, and of a pair of generally L-section edge brackets engaging around edges and over the front face of the panel. The large-area holes are substantially rectangular and the rigid sheet lies against the back face of the filter panel. This holder includes a clip extending along and holding the lower edge of the filter panel, and means such as bolts or self-tapping screws releasably retain the clip to tabs or other structure on the holder so that the clip can be removed to take out the filter panel. The clip is of L-section and closed so that it shields the lower filter-panel edge.

To ensure that the housing sheds water, according to the invention the upper wall is inclined downward away from the side wall.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
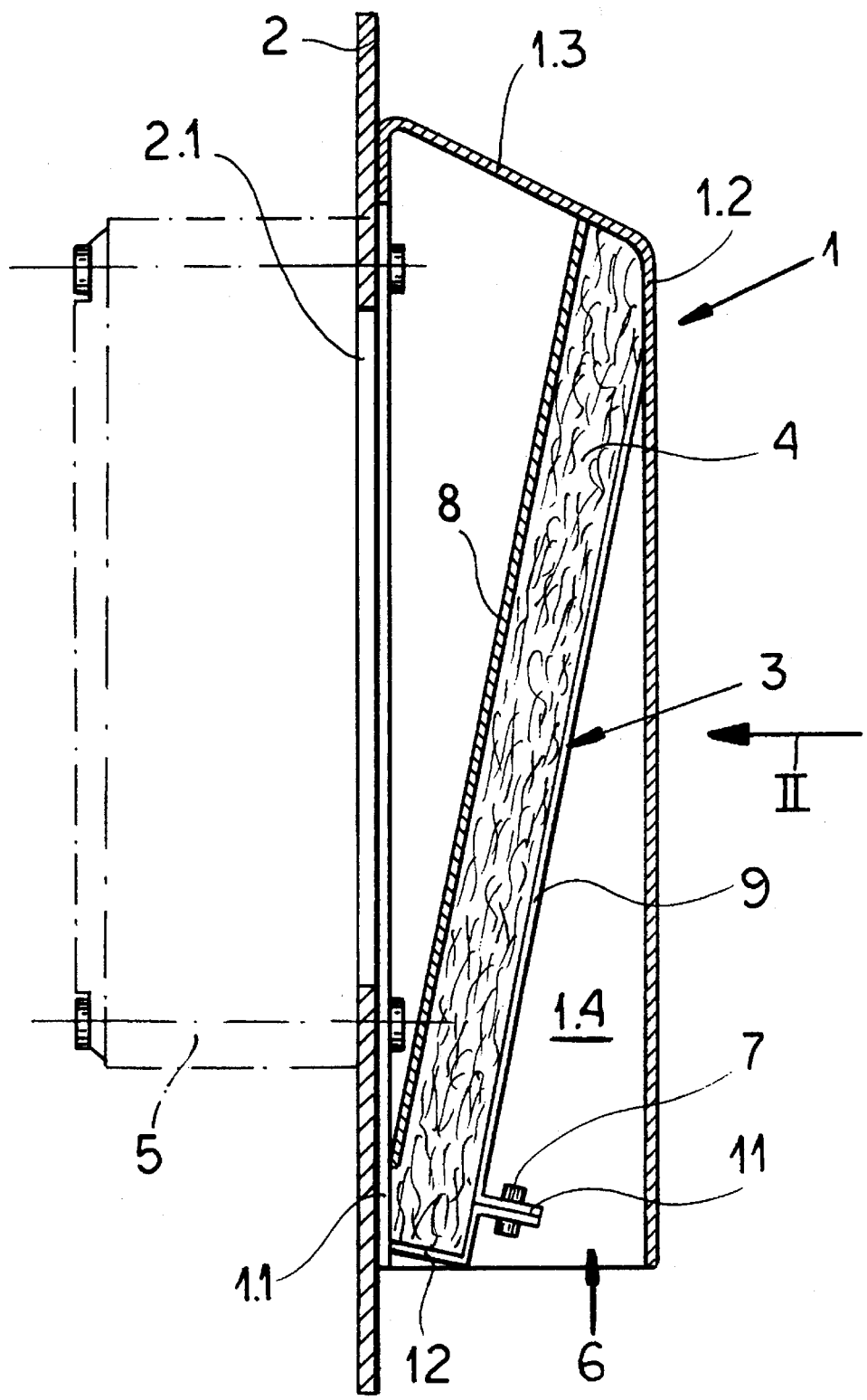
FIG. 1 is a vertical section through the filter assembly of this invention mounted on a piece of electrical equipment.
Figure 2:
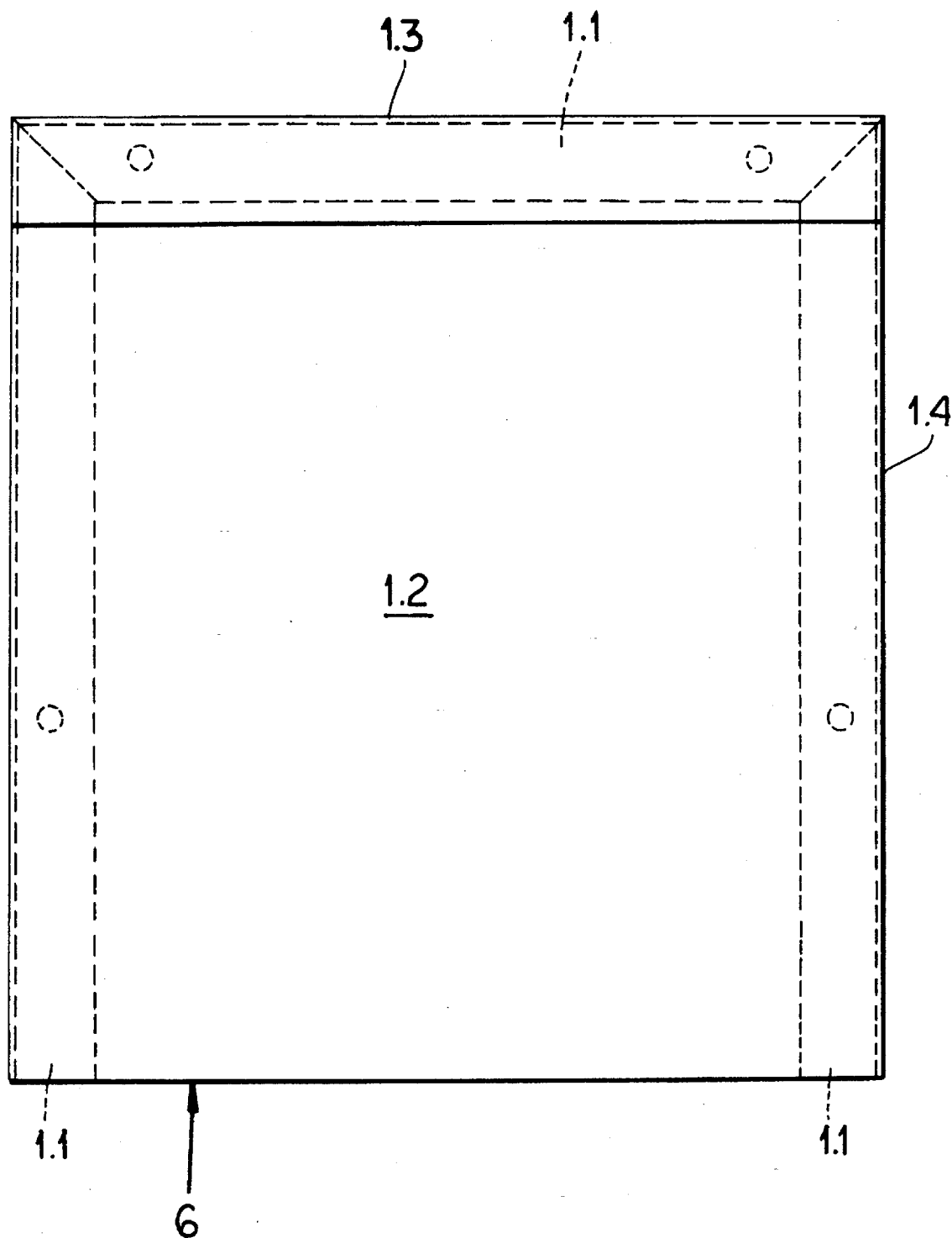
FIG. 2 is a rear end view of the housing of the filter assembly.
Figure 3:
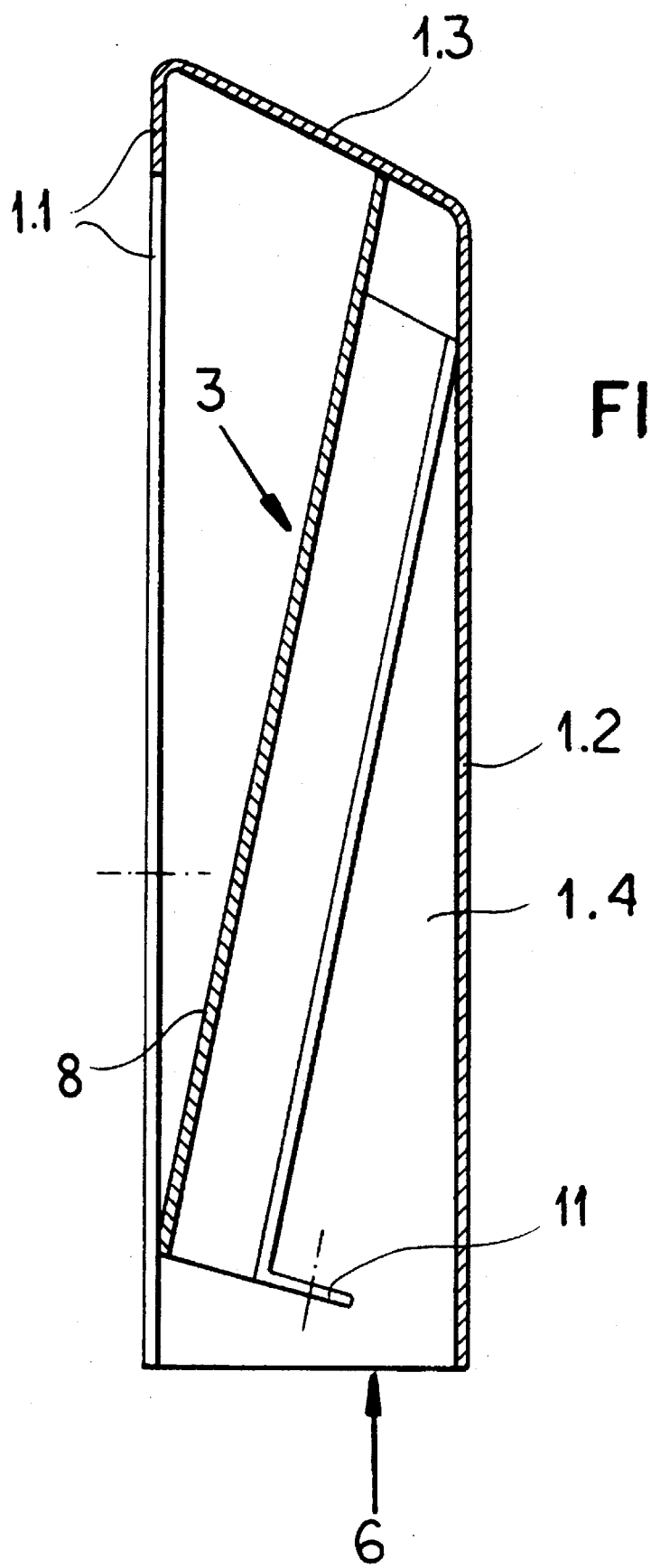
FIG. 3 is a vertical section through the filter-assembly housing and the holder thereof.

As seen in FIGS. 1 through 3 a piece of electrical equipment has a side wall 2 formed with a normally circular vent opening 2-1 and provided on its inside face with a fan 5 and on its outside with a filter-assembly housing 1 formed of sheet metal. The housing with the side wall 2 normally holds electrical switching equipment or the like that must be cooled.

The housing 1 has no back wall, but instead has top and side lips 1-1 that are caulked and bolted to the side wall 2 around the opening 2-1, a rectangular front wall 1-2 that is vertical and parallel to the side wall 2, a top wall 1.3 that is inclined downward away from the side wall 2, and a pair of end walls 1-4 that each extend between an edge of the front wall 1-2 and the lips 1-1. The housing 1 is downwardly open, forming an intake mouth 6.

Figure 4:
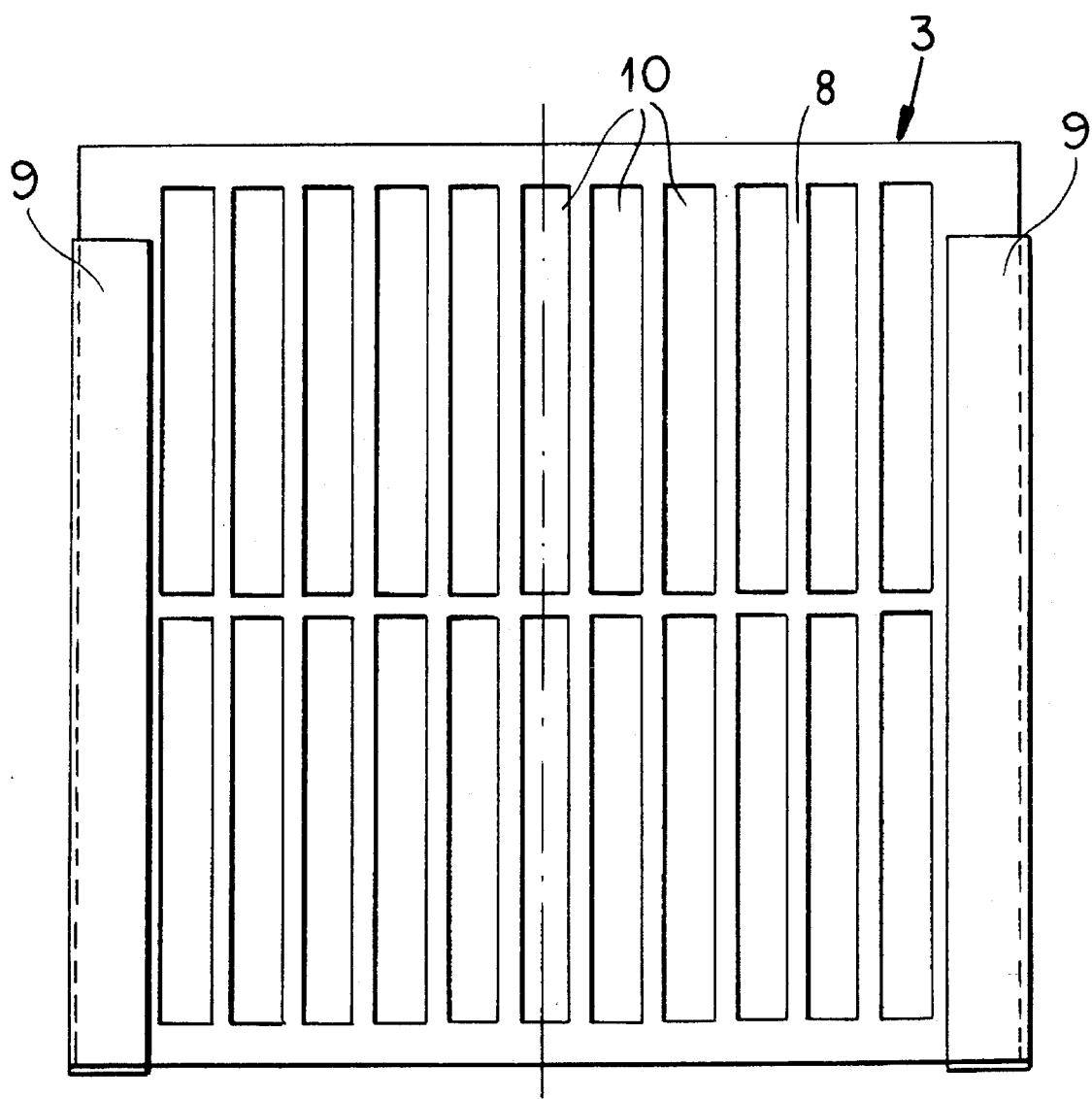
FIG. 4 is a front view of the filter-assembly holder.
Figure 5:
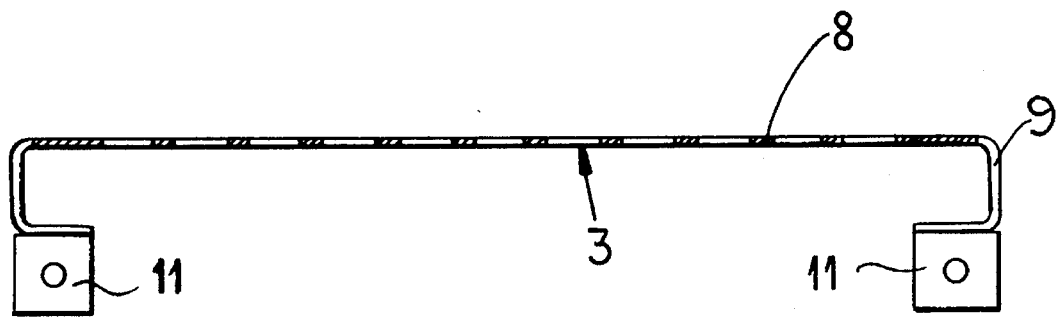
FIG. 5 is a top view of the holder of FIG. 4.
Figure 6A:
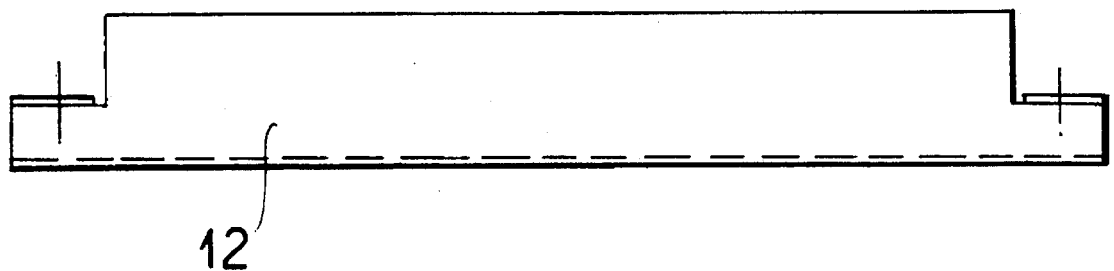
FIGS. 6a and 6b are top and side views of the retaining bracket of the holder.
Figure 6B:
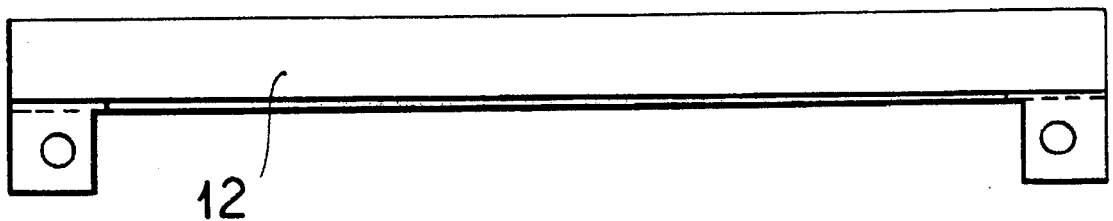

Welded inside the housing 1 is a holder 3 for a rectangular panel or piece 4 of air-pervious filter material, for instance made of a synthetic-resin mat. As also shown in FIGS. 4 and 5 the holder 3 is made of sheet metal and has an array of rectangular holes 10 forming narrow web strips 8 that lie against the back face of the filter panel 4. At its side edges it is formed with L-section bracket strips 9 that engage forwardly around the edges of the panel 4 to hold it in place. The holder 3 extends at an angle to the front wall 1-2 so that when the panel 4 is slid into the brackets 9 the upper edge of its front face fits against the inner face of the front wall 1-2 and the lower edge of its back face bears against the side wall 2 below the opening 2-1. Thus the filter panel 4, when installed, subdivides the interior of the housing 1 into a front compartment open via the mouth 6 and a back compartment open via the vent 2-1 into the housing having the side wall 2.

An L-section retaining clip 12 is secured by bolts 7 to tabs 11 formed on the brackets 9 of the holder 3. This clip 12 is continuous, that is imperforate, so that if some water splashes up into the mouth 6 it will not wet the lower edge of the filter panel 4. The holder 3, clip 12, and panel 4 are of substantially the same width as the housing 1 so that they fit snugly between the end walls 1-4 thereof.

In use the fan 5 can force particle-laden air from the left-hand side of the wall 2 through the hole 2-1 and thence through the filter mat 4 and out the mouth 6.

We claim:

1. In combination with a piece of electrical equipment having a vertical and generally planar side wall formed with a vent opening, a filter assembly comprising:

a housing secured to the side wall at the opening thereof and having a closed top side, a closed front wall, and a pair of closed end walls, the end and front walls forming below the vent opening a downwardly opening mouth;

a panel of air-pervious filter material in the housing having a lower edge below the vent opening, a generally planar back face turned toward the side wall at the vent opening and an opposite and generally planar front face turned away from the side wall and extending substantially parallel to the pack face; and a holder in the housing securing the filter panel therein with the back face operatively engaging the equipment side wall at the lower panel edge below the opening and above the mouth and an upper edge of its front face engaging the housing front wall and with the back face of the panel diverging upwardly away from the equipment side wall.

2. The filter assembly defined in claim 1 wherein the holder is formed of a rigid sheet fixed in the housing, lying against the back face of the filter panel and formed with a plurality of large-area holes defining narrow webs, and a pair of generally L-section edge brackets fixed to the sheet and engaging around edges and over the front face of the panel.

3. The filter assembly defined in claim 2 wherein the large-area holes are substantially rectangular.

4. The filter assembly defined in claim 1 wherein the holder includes:

a clip fixed to the sheet and extending along and holding the lower edge of the filter panel, and means releasably retaining the clip to the sheet and bracket, whereby the clip can be removed to take out the filter panel.

5. The filter assembly defined in claim 4 wherein the clip is of L-section and closed, whereby the clip shields the lower filter-panel edge.

6. The filter assembly defined in claim 1 wherein the upper wall is inclined downwardly away from the side wall.

* * * * *